(12) United States Patent
Shinohara et al.

(10) Patent No.: US 12,384,048 B2
(45) Date of Patent: Aug. 12, 2025

(54) TRANSFER APPARATUS

(71) Applicant: DISCO CORPORATION, Tokyo (JP)

(72) Inventors: Koichi Shinohara, Tokyo (JP); Tomotaka Sawada, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 299 days.

(21) Appl. No.: 18/165,796

(22) Filed: Feb. 7, 2023

(65) Prior Publication Data

US 2023/0264363 A1 Aug. 24, 2023

(30) Foreign Application Priority Data

Feb. 24, 2022 (JP) ................. 2022-026418

(51) Int. Cl.
| | |
|---|---|
| *B25J 11/00* | (2006.01) |
| *B25J 13/08* | (2006.01) |
| *B25J 15/00* | (2006.01) |
| *B25J 19/02* | (2006.01) |

(52) U.S. Cl.
CPC ......... *B25J 11/0095* (2013.01); *B25J 13/089* (2013.01); *B25J 15/0014* (2013.01); *B25J 19/023* (2013.01)

(58) Field of Classification Search
CPC ............ H01L 21/67265; H01L 21/6732; B25J 11/0095; B25J 13/089; B25J 19/023
USPC ................. 700/245–264; 318/568.11–568.25
See application file for complete search history.

(56) References Cited

U.S. PATENT DOCUMENTS

| | | | | |
|---|---|---|---|---|
| 6,188,323 | B1* | 2/2001 | Rosenquist | H01L 21/67265 340/686.5 |
| 6,914,233 | B2* | 7/2005 | Kitazawa | H01L 21/67265 250/221 |
| 8,837,777 | B2* | 9/2014 | Yasuda | H01L 21/67265 382/103 |
| 12,002,696 | B2* | 6/2024 | Sunugatov | G06T 7/13 |
| 2005/0035313 | A1* | 2/2005 | Garssen | H01L 21/67265 250/559.33 |
| 2019/0067057 | A1* | 2/2019 | Hu | H01L 21/67265 |
| 2021/0050244 | A1* | 2/2021 | Kakinuma | H01L 21/68707 |
| 2021/0407831 | A1* | 12/2021 | Sunugatov | G06T 7/13 |

FOREIGN PATENT DOCUMENTS

JP  2001284303 A  10/2001

* cited by examiner

*Primary Examiner* — Wade Miles
*Assistant Examiner* — Sidney Leigh Molnar
(74) *Attorney, Agent, or Firm* — Greer Burns & Crain Ltd.

(57) ABSTRACT

With reference to a plurality of images formed by an imaging unit, the position of a robot hand to be inserted into a cassette at the time of unloading a workpiece from the cassette is determined. Hence, it is not necessary for an operator to recognize in advance configuration details of the cassette and a warp or bending of the workpiece accommodated in the cassette. Accordingly, the operator's work at the time of unloading the workpiece from the cassette is simplified.

9 Claims, 6 Drawing Sheets

TRANSFER APPARATUS

BACKGROUND OF THE INVENTION

Field of the Invention

The present invention relates to a transfer apparatus that transfers a workpiece.

Description of the Related Art

Chips having devices such as integrated circuits (ICs) formed thereon are essential components in various kinds of electronic equipment such as mobile phones and personal computers. Such chips are manufactured by, for example, dividing a workpiece such as a wafer having a front surface on which multiple devices are formed, into regions including respective devices.

Workpieces having devices formed thereon are often thinned before being divided, for the purpose of reduction in size and weight of chips, for example. Examples of a method for thinning a workpiece include grinding carried out by a grinding apparatus including a chuck table for holding a front surface (lower surface) side of the workpiece and a grinding wheel that is disposed above the chuck table and has a plurality of grinding stones arranged in an annular and discrete manner.

In order to grind the workpiece in this case, as a premise, the workpiece needs to be loaded onto the grinding apparatus. In a general chip manufacturing process, for example, workpieces corresponding to one lot (substantially 25 workpieces) are accommodated in a cassette, and this cassette is loaded onto a placement surface of a cassette table provided in the grinding apparatus. Further, the grinding apparatus generally has a transfer robot (unloading means) that uses its robot hand to hold the workpiece and unload the workpiece from the cassette (refer to Japanese Patent Laid-open No. 2001-284303, for example).

SUMMARY OF THE INVENTION

The cassette generally has a pair of side walls that face each other and are formed with a plurality of grooves on respective inner side surfaces. A workpiece such as a wafer is accommodated in the cassette such that an outer peripheral edge of the workpiece is disposed in one of the plurality of grooves of each side wall. Meanwhile, configuration details of the cassette including a distance between the pair of side walls and an interval for arranging the plurality of grooves often vary depending on the size of workpieces to be accommodated.

Hence, when the transfer robot is used to unload a workpiece from the cassette, an operator is required to recognize the configuration details of the cassette in advance and input, into the transfer robot, information for setting an appropriate position of the robot hand to be inserted into the cassette. However, in a case in which many different kinds of cassettes have different configuration details, it is troublesome for the operator to recognize the configuration details of each cassette.

Moreover, even when cassettes of the same kind are used, dimensional errors may occur in configuration details of the cassettes due to a difference in manufacturer, production lot, or the like. In such a case, when the transfer robot is used to unload a workpiece from a cassette, even if the operator makes reference to information that the operator can get in advance, it may be difficult to set an appropriate position of the robot hand to be inserted into the cassette.

In addition, due to a warp or bending of a workpiece accommodated in a cassette, the appropriate position of the robot hand to be inserted into the cassette to unload the workpiece from the cassette may change. To cope with such a case, the operator is required to find the appropriate position of the robot hand to be inserted into the cassette on each occasion, which leads to complex work.

In view of the problems described above, it is an object of the present invention to provide a transfer apparatus that can simplify the operator's work required when a workpiece is unloaded from the cassette.

In accordance with an aspect of the present invention, there is provided a transfer apparatus including a cassette table, a transfer robot, and a controller. The cassette table has a placement surface on which a cassette that has a pair of side walls facing each other and accommodates a workpiece is placed, the pair of side walls having respective inner side surfaces on each of which a plurality of grooves are formed, the workpiece being accommodated with its outer peripheral edge disposed in one of the grooves of each of the side walls. The transfer robot unloads the workpiece from the cassette. The controller controls operation of the transfer robot. The transfer robot includes a transfer arm having a tip end that is movable in a first direction perpendicular to the placement surface and a second direction parallel to the placement surface, a robot hand that is disposed at the tip end of the transfer arm and is capable of holding the workpiece, and an imaging unit that is fixed to the transfer arm and is capable of imaging a region included in the cassette placed on the placement surface. The controller causes the imaging unit to image different regions of the cassette accommodating the workpiece to form a plurality of images, and thereafter determines a position in the first direction and a position in the second direction of the robot hand to be inserted into the cassette at the time of unloading the workpiece from the cassette, with reference to the plurality of images.

Preferably, the plurality of images include a side-wall image formed by imaging a region containing two or more grooves adjacent in the first direction among the plurality of grooves, and the controller measures an interval for arranging the plurality of grooves in the first direction, with reference to the side-wall image, and thereafter determines the position in the first direction of the robot hand at the time of unloading the workpiece from the cassette, with reference to the measured interval.

In the present invention, with reference to a plurality of images formed by imaging by an imaging unit, the position of a robot hand to be inserted into a cassette at the time of unloading a workpiece from the cassette is determined. Hence, in the present invention, it is not necessary for an operator to recognize in advance configuration details of the cassette and a warp or bending of the workpiece accommodated in the cassette. Accordingly, the operator's work at the time of unloading the workpiece from the cassette is simplified.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
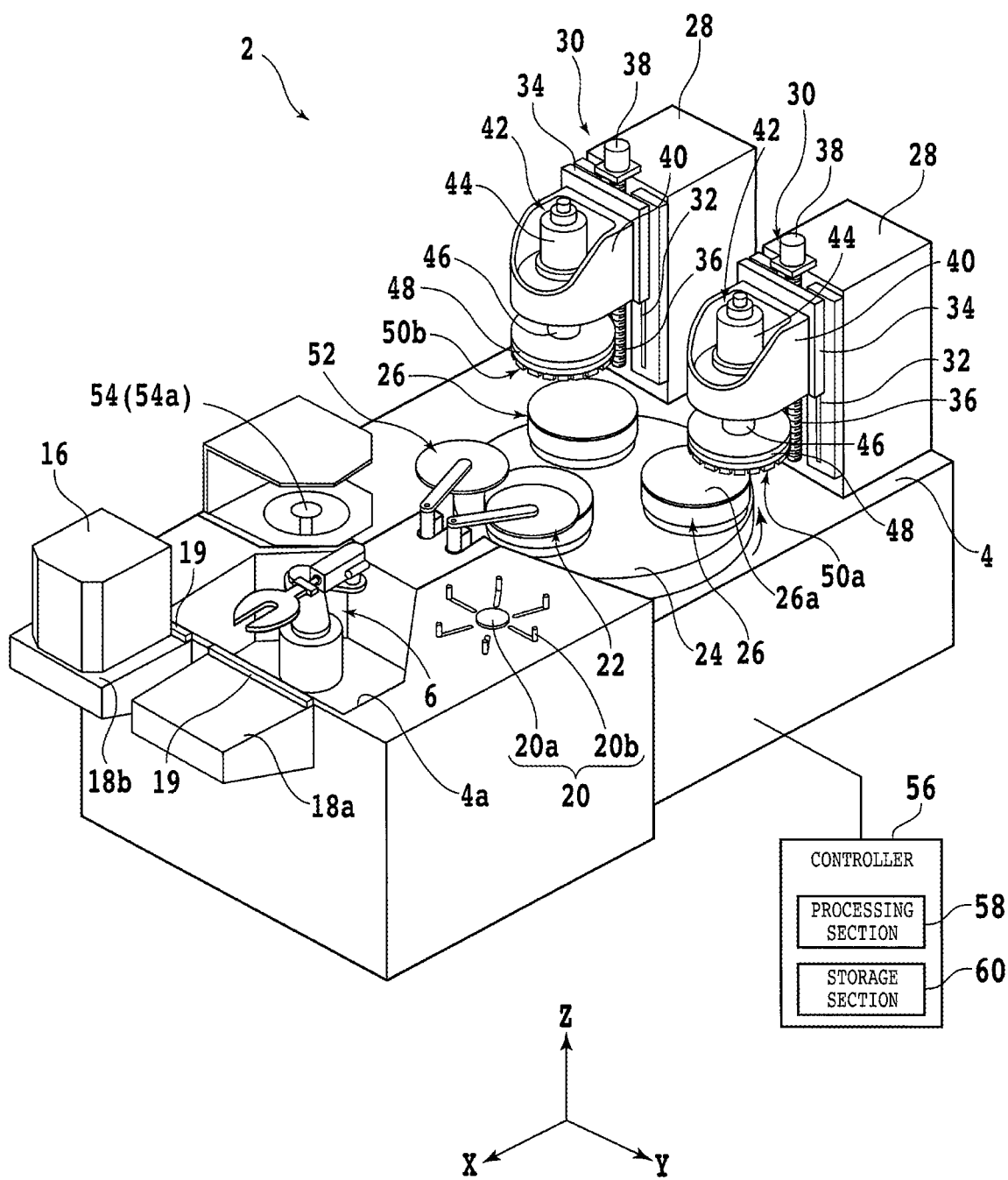
FIG. 1 is a perspective view schematically illustrating an example of a grinding apparatus including a transfer apparatus that transfers a workpiece.

A preferred embodiment of the present invention will be described hereinbelow with reference to the accompanying drawings. FIG. 1 is a perspective view schematically illustrating an example of a grinding apparatus including a transfer apparatus that transfers a workpiece. It is to be noted that, in FIG. 1, some components of the grinding apparatus are illustrated as functional blocks. Further, an X-axis direction (front-rear direction) and a Y-axis direction (left-right direction) indicated in FIG. 1 are directions perpendicular to each other in a horizontal plane, and a Z-axis direction (up-down direction or height direction) is a direction (vertical direction) perpendicular to both the X-axis direction and the Y-axis direction.

The grinding apparatus, denoted by 2, in FIG. 1 includes a base 4 that supports various components. The base 4 has an opening 4a defined on a front-end side of an upper surface thereof. In the opening 4a, there are provided a transfer robot 6 and a Y-axis movement mechanism (not illustrated) for moving the transfer robot 6 along the Y-axis direction. The Y-axis movement mechanism includes, for example, a ball screw, a motor, and the like.

Figure 2:
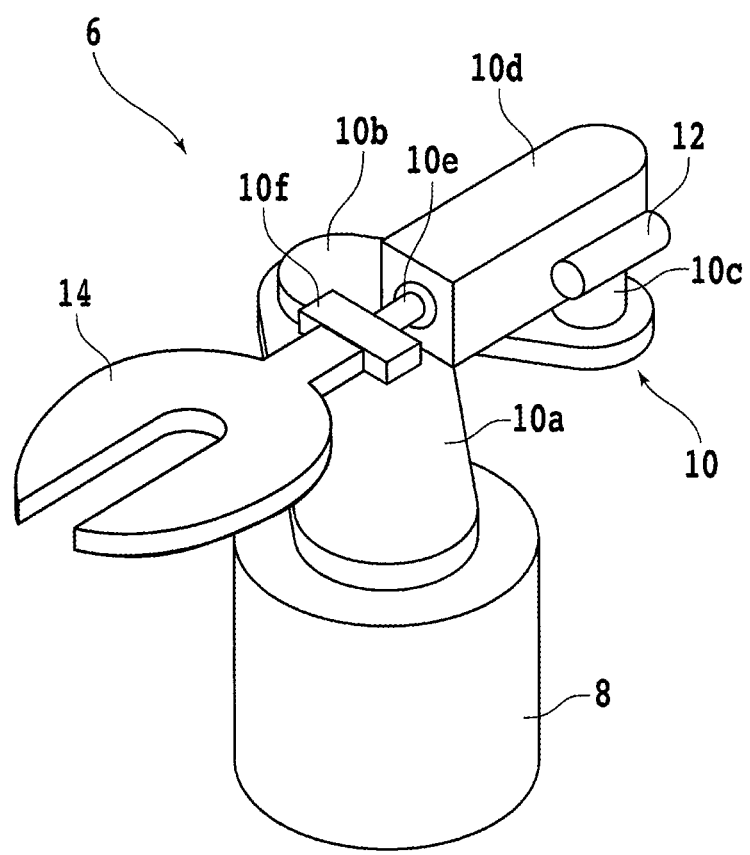
FIG. 2 is a perspective view schematically illustrating an example of a transfer robot.

FIG. 2 is a perspective view schematically illustrating the transfer robot 6. The transfer robot 6 includes a first drive portion 8 in a columnar shape extending in the Z-axis direction. The first drive portion 8 has its lower portion fixed to the Y-axis movement mechanism. Inside the first drive portion 8, there is provided an actuator (not illustrated) such as an air cylinder that has a piston rod movable along the Z-axis direction and that can rotate about its rotational axis extending along the Z-axis direction.

Further, the first drive portion 8 has an opening defined at an upper surface side thereof for allowing the piston rod to pass through. To an upper end portion of the piston rod, a transfer arm 10 is coupled. Hence, the transfer arm 10 is movable along the Y-axis direction and the Z-axis direction. That is, when the Y-axis movement mechanism is actuated, the transfer arm 10 moves along the Y-axis direction together with the first drive portion 8. When the actuator provided inside the first drive portion 8 is energized, the transfer arm 10 moves along the Z-axis direction (moves up and down).

The transfer arm 10 is a robot arm having a plurality of joints. More specifically, the transfer arm 10 has a first arm portion 10a in a plate shape extending in a direction perpendicular to the Z-axis direction. The first arm portion 10a is coupled at a lower side of one end portion thereof to the upper end portion of the piston rod in such a manner that the first arm portion 10a moves and rotates together with the piston rod. The first arm portion 10a is coupled at an upper side of the other end portion thereof to a lower side of a columnar first joint portion (not illustrated).

The first joint portion is coupled at an upper side thereof to a second arm portion 10b in a plate shape extending in a direction perpendicular to the Z-axis direction. The second arm portion 10b is coupled at a lower side of one end portion thereof to the upper side of the other end portion of the first arm portion 10a through the first joint portion in such a manner that the second arm portion 10b can rotate about its rotational axis extending along the Z-axis direction. The second arm portion 10b is coupled at an upper side of the other end portion thereof to a lower side of a columnar second joint portion 10c.

The second joint portion 10c is coupled at an upper side thereof to a second drive portion 10d in a rectangular parallelepiped shape extending in a direction perpendicular to the Z-axis direction. The second drive portion 10d is coupled at a lower side of one end portion thereof to the upper side of the other end portion of the second arm portion 10b through the second joint portion 10c in such a manner that the second drive portion 10d can rotate about its rotational axis extending along the Z-axis direction.

Moreover, the second drive portion 10d has, fixed to a side surface thereof, an imaging unit 12 extending along the same direction as that of the second drive portion 10d. The imaging unit 12 includes, for example, a light source such as a light emitting diode (LED), an objective lens, and an imaging element such as a charge coupled device (CCD) image sensor or a complementary metal oxide semiconductor (CMOS) image sensor. The imaging unit 12 images a structure existing in, as viewed from the imaging unit 12, a direction from the other end portion toward the one end portion of the second drive portion 10d to form an image.

Inside the second drive portion 10d, there is provided a motor (not illustrated) for rotating a spindle 10e about its rotational axis extending along a direction perpendicular to the Z-axis direction. The spindle 10e extends through an opening defined at a surface of the second drive portion 10d on the other end portion side and has its tip end portion exposed outward. To the tip end portion of the spindle 10e, a base end portion in a rectangular parallelepiped shape of a robot hand 14 is coupled through a coupling portion 10f in a plate shape. That is, the robot hand 14 is disposed at a tip end of the transfer arm 10.

The robot hand 14 further has an elliptic plate portion integrated with the base end portion thereof. More specifically, the elliptic plate portion has such a shape that the major axis of the ellipse extends in parallel to the spindle 10e, and has a linear cutout formed from a center to a tip end thereof. In one surface of the elliptic plate portion of the robot hand 14, a plurality of suction holes (not illustrated) are defined.

The suction holes are connected to a suction source (not illustrated) such as an ejector via, for example, a passage provided inside the robot hand 14 or a valve for controlling a flow of gas. When the suction source is actuated with the valve opened, a suction force acts on a space near the one surface of the elliptic plate portion of the robot hand 14.

Hence, the one surface functions as a holding surface to hold a workpiece under suction. In the transfer robot 6, when the spindle 10e is rotated in a state in which a workpiece is held by the holding surface of the robot hand 14, the workpiece can be turned upside down. In other words, the workpiece can be held on either an upper side or a lower side of the robot hand 14.

Figure 3:
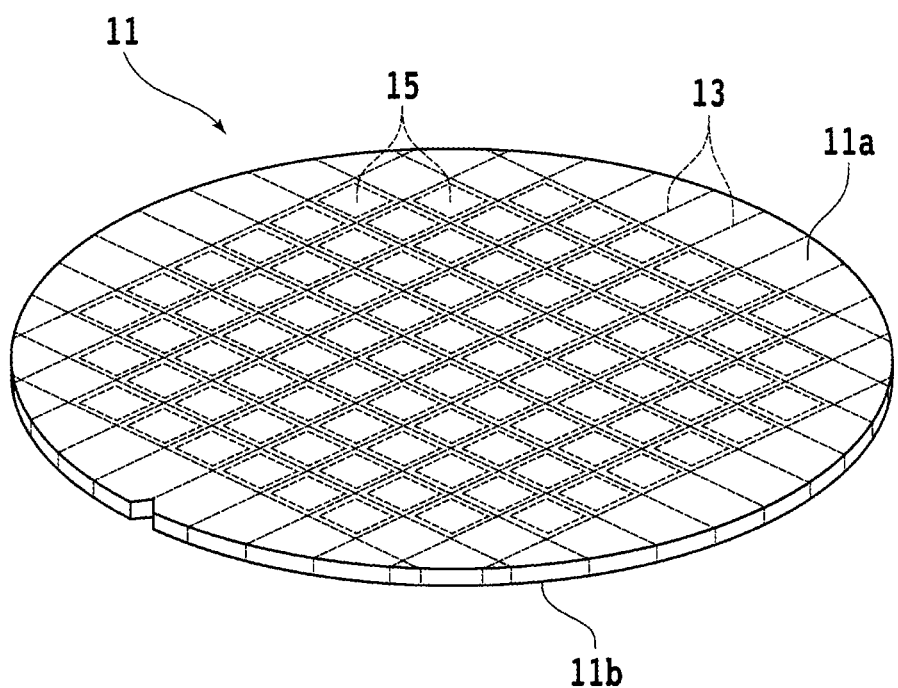
FIG. 3 is a perspective view schematically illustrating an example of the workpiece.

FIG. 3 is a perspective view schematically illustrating an example of a workpiece transferred by the transfer robot 6. The workpiece, denoted by 11, in FIG. 3 is a wafer consisting of a semiconductor material such as silicon (Si), for example. The workpiece 11 is partitioned into a plurality of regions by a plurality of projected dicing lines 13 that intersect each other, and devices 15 such as ICs or large-scale integration (LSI) circuits are formed in the respective regions on a front surface 11a of the workpiece 11.

It is to be noted that the material, shape, configuration, size, and the like of the workpiece 11 are not limited. For example, the workpiece 11 may be a substrate consisting of another semiconductor material or a material such as ceramics, resin, or metal. Likewise, the kind, quantity, shape, configuration, size, arrangement, and the like of the devices 15 are not limited either.

Further, a film tape having a diameter substantially equal to that of the workpiece 11 may be attached to the front surface 11a of the workpiece 11. The tape consists of resin, for example, and protects the devices 15 by mitigating an impact to be applied to the front surface 11a side of the workpiece 11 when the workpiece 11 is ground on a back surface 11b side thereof.

Figure 4:
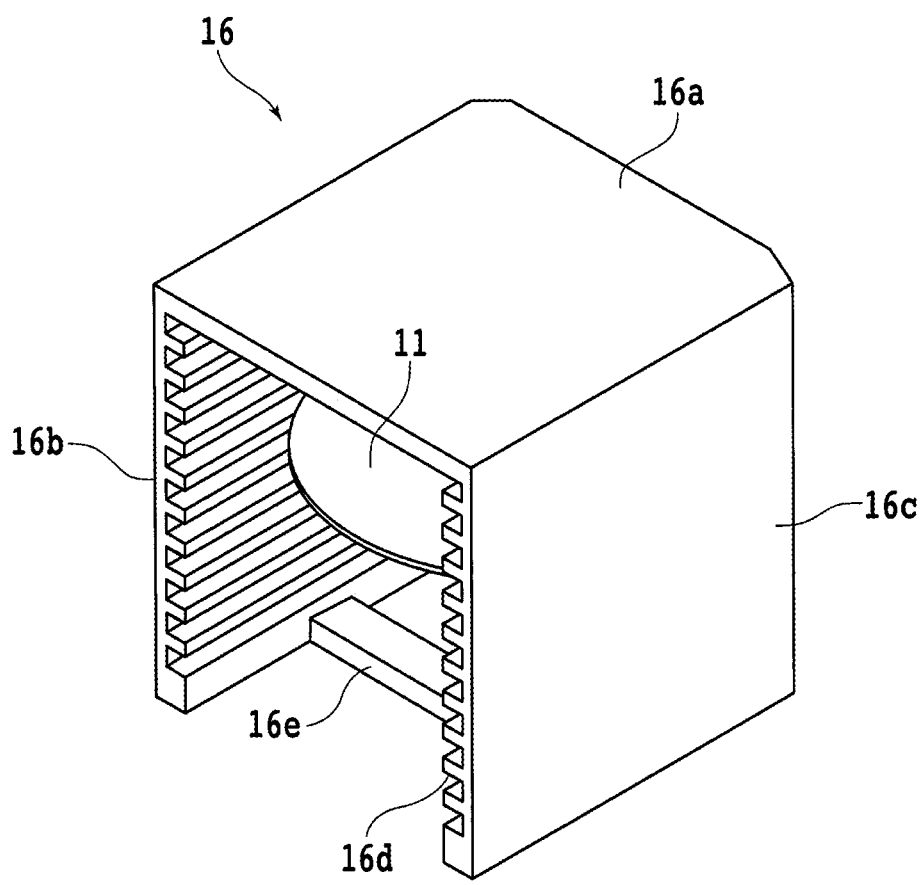
FIG. 4 is a perspective view schematically illustrating an example of a cassette.

FIG. 4 is a perspective view schematically illustrating an example of a cassette accommodating the workpiece 11. The cassette, denoted by 16, in FIG. 4 has a top plate 16a in a flat-plate shape. The top plate 16a is a rectangular flat plate having four corners, with a pair of adjacent corners of the four corners chamfered and the other pair of corners not chamfered.

On a lower side of an end portion (rear end portion) positioned between the pair of chamfered corners of the top plate 16a, an upper end portion of a side wall (not illustrated) extending in a direction (height direction) perpendicular to the top plate 16a is fixed. On respective lower sides of two end portions (left end portion and right end portion) each positioned between a chamfered corner and an unchamfered corner of the top plate 16a, upper end portions of side walls 16b and 16c extending in the height direction are fixed.

Meanwhile, on a lower side of an end portion (front end portion) positioned between the pair of unchamfered corners of the top plate 16a, no side wall extending in the height direction is fixed. That is, the lower side of the front end portion of the top plate 16a is opened, serving as an opening surface. On an inner side surface of each of the side walls 16b and 16c, a plurality of grooves 16d each extending in a direction perpendicular to the height direction are formed at predetermined intervals in the height direction.

More specifically, each of the plurality of grooves 16d formed on the inner side surface of the side wall 16b faces corresponding one of the plurality of grooves 16d formed on the inner side surface of the side wall 16c. Each groove 16d is substantially rectangular in cross section. In other words, each groove 16d has a pair of inner side surfaces lying in a direction substantially perpendicular to the height direction and a bottom surface lying substantially in parallel to the height direction.

When the workpiece 11 is accommodated in the cassette 16, an outer peripheral edge of the workpiece 11 is placed on the inner side surface, which is the farther from the top plate 16a, of the pair of inner side surfaces of one of the plurality of grooves 16d of each of the side walls 16b and 16c. That is, the outer peripheral edge of the workpiece 11 is supported on the inner side surfaces, which are the farther from the top plate 16a, of the respective pairs of inner side surfaces of one facing pair of grooves 16d.

It is to be noted that the number of grooves 16d formed on the inner side surface of the side wall 16b and the number of grooves 16d formed on the inner side surface of the side wall 16c are not limited. For example, the grooves 16d corresponding to the number of workpieces 11 of one lot (substantially 25 workpieces) may be formed in the cassette 16.

Further, a lower portion of the side wall 16b and a lower portion of the side wall 16c are coupled to each other through a connection member 16e in an elongated plate shape. With a plurality of workpieces 11 accommodated therein, for example, the cassette 16 is loaded onto a cassette table 18a or 18b of the grinding apparatus 2 illustrated in FIG. 1.

The cassette tables 18a and 18b each have an upper surface (placement surface) extending in parallel to the X-axis direction and the Y-axis direction, and a prism-shaped cassette stopper 19 extending along the Y-axis direction is provided at an end portion of the placement surface on the opening 4a side. The cassette 16 is placed on the placement surface of the cassette table 18a or 18b in such a manner that the opening surface of the cassette 16 is positioned on the opening 4a side and lower end portions of the side walls 16b and 16c make contact with the cassette stopper 19.

In this case, outer side surfaces of the side walls 16b and 16c of the cassette 16 lie in parallel to the X-axis direction. This prevents the robot hand 14 of the transfer robot 6 from bumping against the inner side surfaces of the side walls 16b and 16c when the robot hand 14 is inserted into the cassette 16.

Further, on an obliquely rear side of the transfer robot 6, there is provided a position adjustment mechanism 20 for adjusting the position of the workpiece 11. The position adjustment mechanism 20 includes, for example, a disk-shaped table 20a having an upper surface (support surface) that can support the workpiece 11 thereon and a plurality of pins 20b arranged around the table 20a.

When the workpiece 11 unloaded by the transfer robot 6 from the cassette 16 is loaded onto the support surface of the table 20a, the plurality of pins 20b move in a radial direction of the table 20a in such a manner as to make contact with the outer peripheral edge of the workpiece 11. The workpiece 11 thus has its center aligned with a predetermined position in the X-axis direction and the Y-axis direction. It is to be noted that details of unloading of the workpiece 11 from the cassette 16 carried out by the transfer robot 6 will be described later.

On an obliquely rear side of the position adjustment mechanism 20 (on a rear side of the transfer robot 6), there is provided a transfer mechanism 22 that holds the workpiece 11 and transfers the workpiece 11 rearward. The transfer mechanism 22 includes a holding pad for holding the workpiece 11 under suction and an arm connected to the holding pad. The transfer mechanism 22 transfers the workpiece 11 having been adjusted in position by the position adjustment mechanism 20, rearward by turning the holding pad with use of the arm.

On a rear side of the transfer mechanism 22, there is provided a turn table 24 in a disk shape. The turn table 24 is connected to a rotational drive source (not illustrated) such as a motor and rotates about its rotational axis extending in substantially parallel to the Z-axis direction. The turn table 24 has, on an upper surface thereof, three chuck tables 26 each for holding the workpiece 11 thereon.

Figure 5:
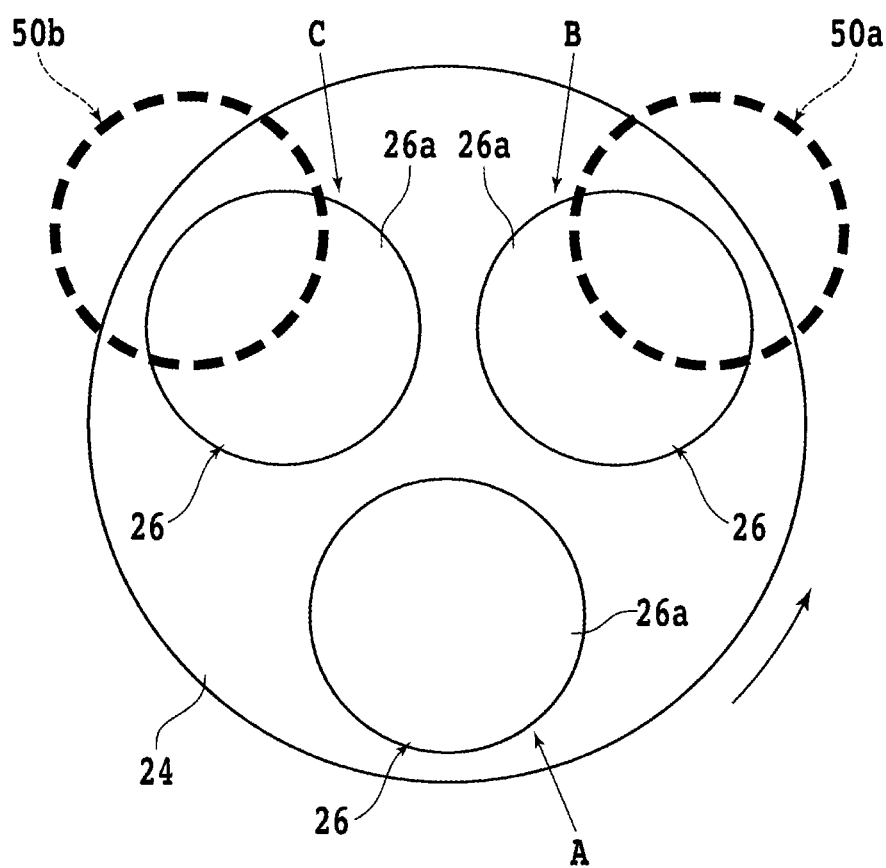
FIG. 5 is a plan view schematically illustrating configurations of a turn table and peripheral parts thereof.

The three chuck tables 26 are arranged substantially at equal intervals along a circumferential direction of the turn table 24. It is to be noted that the number of chuck tables 26 arranged on the turn table 24 is not limited. FIG. 5 is a plan view schematically illustrating configurations of the turn table 24 and peripheral parts thereof.

It is to be noted that, in FIG. 5, for convenience of explanation, some components are indicated by broken lines. The transfer mechanism 22 loads the workpiece 11 held by the holding pad onto the chuck table 26 positioned in a loading/unloading area A (refer to FIG. 5) adjacent to the transfer mechanism 22. The turn table 24 rotates, for example, in a direction indicated by an arrow in FIG. 1 and FIG. 5, and each of the chuck tables 26 moves to the loading/unloading area A, a rough-grinding area B, and a finish-grinding area C in this order.

Each of the chuck tables 26 is connected to a rotational drive source (not illustrated) such as a motor and rotates about its rotational axis extending in substantially parallel to the Z-axis direction. The chuck table 26 has a disk-shaped frame body consisting of a metallic material such as stainless steel, for example. On an upper surface side of the frame body, there is formed a recessed portion having a circular opening at its upper end. A disk-shaped porous plate consisting of ceramics or the like is fixed in the recessed portion.

The chuck table 26 has an upper surface formed into a shape corresponding to a side surface of a cone that has its center slightly protruding compared to its outer edge, and the upper surface functions as a holding surface 26a for holding the workpiece 11 thereon. That is, the chuck table 26 has the holding surface 26a for holding the workpiece 11 thereon, at an upper portion thereof.

The holding surface 26a is connected to a suction source (not illustrated) such as an ejector through a suction passage (not illustrated) or the like formed inside the chuck table 26. When the suction source is actuated, a suction force acts on a space near the holding surface 26a, so that the workpiece 11 having been loaded onto the chuck table 26 is held under suction.

As illustrated in FIG. 1, two columnar support structures 28 are provided on respective rear sides of the rough-grinding area B and the finish-grinding area C (on a rear side of the turn table 24). The support structures 28 each have a Z-axis movement mechanism 30 provided on a front surface side thereof. The Z-axis movement mechanism 30 has a pair of guide rails 32 that are fixed to the front surface of the support structure 28 and extend along the Z-axis direction.

On a front surface side of the pair of guide rails 32, a movable plate 34 is coupled in such a manner as to slidably move along the pair of guide rails 32. Between the pair of guide rails 32, a screw shaft 36 extending along the Z-axis direction is disposed. To one end portion of the screw shaft 36, a motor 38 for rotating the screw shaft 36 about its rotational axis is coupled.

A nut (not illustrated) that contains a number of balls rollingly movable in a helical groove formed on a surface of the screw shaft 36 is operatively threaded over the screw shaft 36, which constitutes a ball screw. When the motor 38 is energized to rotate the screw shaft 36 about its rotational axis, the balls roll in the helical groove and circulate through the nut, causing the nut to move along the Z-axis direction. The nut is fixed to a rear surface (back surface) side of the movable plate 34.

Accordingly, when the screw shaft 36 is rotated about its rotational axis by the motor 38 coupled to the one end portion of the screw shaft 36, the movable plate 34 move along the Z-axis direction together with the nut. Further, a fixture 40 is provided to a front surface side of the movable plate 34. The fixture 40 supports a grinding unit 42 for grinding the workpiece 11. The grinding unit 42 includes a spindle housing 44 fixed to the fixture 40.

The spindle housing 44 houses a spindle 46 in such a manner that the spindle 46 can rotate about its rotational axis extending along the Z-axis direction. The spindle 46 has a lower end portion exposed from a lower end surface of the spindle housing 44. A disk-shaped mount 48 is fixed to the exposed lower end portion of the spindle 46.

To a lower surface of the mount 48 of the grinding unit 42 on the rough-grinding area B side, a first grinding wheel 50a for rough grinding is mounted. The first grinding wheel 50a for rough grinding includes a first wheel base that consists of metal such as stainless steel or aluminum and that has a diameter substantially equal to that of the mount 48.

On a lower surface of the first wheel base, there are provided a plurality of first grinding stones that are arranged in an annular manner and that are formed by bonding abrasive grains of diamond or the like suitable for rough grinding by using a vitrified bond, a resinoid bond, or other kind of bond. In the spindle housing 44 of the grinding unit 42 on the rough-grinding area B side, a first rotational drive source (not illustrated) such as a motor connected to an upper end side of the spindle 46 is housed.

When the first rotational drive source is actuated to rotate the spindle 46, the first grinding wheel 50a rotates about its rotational axis. In the vicinity of the first grinding wheel 50a, there is provided a liquid supply nozzle (not illustrated) that can supply liquid (grinding liquid) such as pure water to a part (processing point) where the workpiece 11 and the first grinding stones make contact with each other. It is to be noted that, instead of the liquid supply nozzle or in addition to the liquid supply nozzle, a liquid supply port to be used for supplying liquid may be provided to the first grinding wheel 50a.

Similarly, to a lower surface of the mount 48 of the grinding unit 42 on the finish-grinding area C side, a second grinding wheel 50b for finish grinding is mounted. The second grinding wheel 50b for finish grinding includes a second wheel base that consists of metal such as stainless steel or aluminum and that has a diameter substantially equal to that of the mount 48.

On a lower surface of the second wheel base, there are provided a plurality of second grinding stones that are arranged in an annular manner and that are formed by bonding abrasive grains of diamond or the like suitable for finish grinding by using a vitrified bond, a resinoid bond, or other kind of bond. In the spindle housing 44 of the grinding unit 42 on the finish-grinding area C side, a second rotational drive source (not illustrated) such as a motor connected to an upper end side of the spindle 46 is housed.

When the second rotational drive source is actuated to rotate the spindle 46, the second grinding wheel 50b rotates about its rotational axis. In the vicinity of the second grinding wheel 50b, there is provided a liquid supply nozzle (not illustrated) that can supply liquid (grinding liquid) such as pure water to a part (processing point) where the workpiece 11 and the second grinding stones make contact with each other. It is to be noted that, instead of the liquid supply nozzle or in addition to the liquid supply nozzle, a liquid supply port to be used for supplying liquid may be provided to the second grinding wheel 50b.

The workpiece 11 held on each chuck table 26 is successively ground by the two grinding units 42 described above.

More specifically, the workpiece 11 held on the chuck table 26 positioned in the rough-grinding area B is ground by the grinding unit 42 on the rough-grinding area B side, and the workpiece 11 held on the chuck table 26 positioned in the finish-grinding area C is ground by the grinding unit 42 on the finish-grinding area C side.

At a position in front of the loading/unloading area A and on a side of the transfer mechanism 22, there is provided another transfer mechanism 52 that holds the workpiece 11 having been ground and transfers the workpiece 11 forward. The transfer mechanism 52 includes a holding pad for holding the workpiece 11 under suction and an arm connected to the holding pad. The transfer mechanism 52 transfers the workpiece 11 having been ground, forward from the chuck table 26 by turning the holding pad with use of the arm.

In front of the transfer mechanism 52, there is provided a cleaning unit 54 that cleans the workpiece 11 transferred thereto by the transfer mechanism 52. The cleaning unit 54, for example, includes a spinner table 54a that has an upper surface (support surface) capable of supporting the workpiece 11 thereon and that spins with the workpiece 11 held on the support surface, and a nozzle (not illustrated) that ejects a cleaning fluid toward the workpiece 11 held by the spinner table 54a.

The workpiece 11 having been cleaned by the cleaning unit 54 is unloaded from the spinner table 54a by the transfer robot 6 and loaded into the cassette 16. Operation of the respective components of the grinding apparatus 2 is controlled by a controller 56 incorporated in the grinding apparatus 2. The controller 56 includes, for example, a processing section 58 that controls the respective components of the grinding apparatus 2 and a storage section 60 that stores therein various kinds of information (data, programs, and the like) used in the processing section 58.

The storage section 60 stores therein, for example, a width (length in the Y-axis direction) of the placement surfaces of the cassette tables 18a and 18b. The function of the processing section 58 is implemented, for example, by a central processing unit (CPU) that reads and executes programs stored in the storage section 60. The function of the storage section 60 is implemented by at least one of a semiconductor memory such as a dynamic random access memory (DRAM), a static random access memory (SRAM), or a NAND flash memory and a magnetic storage device such as a hard disk drive (HDD).

The grinding apparatus 2 may further include components other than those described above. For example, the grinding apparatus 2 may include a touch panel that has a touch sensor for inputting an instruction by the operator to the controller 56 and a display for outputting various kinds of information for the operator.

It is to be noted that the grinding apparatus 2 illustrated in FIG. 1 can also be expressed as including a transfer apparatus that mainly has the transfer robot 6. More specifically, the transfer apparatus includes the cassette tables 18a and 18b each having the placement surface on which the cassette 16 is to be placed, the transfer robot 6 that unloads the workpiece 11 from the cassette 16, and the controller 56 that controls operation of the transfer robot 6.

An example of operation of the transfer robot 6 at the time of unloading the workpiece 11 from the cassette 16 will be described hereinbelow with reference to FIG. 6A, FIG. 6B, and FIG. 6C. In this operation, first, the cassette 16 is placed on the placement surface of the cassette table 18a or 18b in such a manner that the opening surface of the cassette 16 is positioned on the opening 4a side and the lower end portions of the side walls 16b and 16c make contact with the cassette stopper 19. Then, the imaging unit 12 is positioned at such a position that the imaging unit 12 can image one end of the placement surface of the cassette table 18a or 18b and a space right above the one end.

More specifically, the processing section 58 causes the Y-axis movement mechanism provided inside the opening 4a to be actuated in such a manner that the transfer robot 6 is positioned on a rear side of one end of the placement surface of the cassette table 18a or 18b. Then, the processing section 58 controls the actuator provided inside the first drive portion 8 of the transfer robot 6 to move the imaging unit 12 and the like up and down and cause the first arm portion 10a, the second arm portion 10b, and/or the second drive portion 10d to rotate about their respective rotational axes, in such a manner that the objective lens of the imaging unit 12 faces forward and is positioned at a height substantially equal to that of the placement surface of the cassette table 18a or 18b.

Figure 6A:
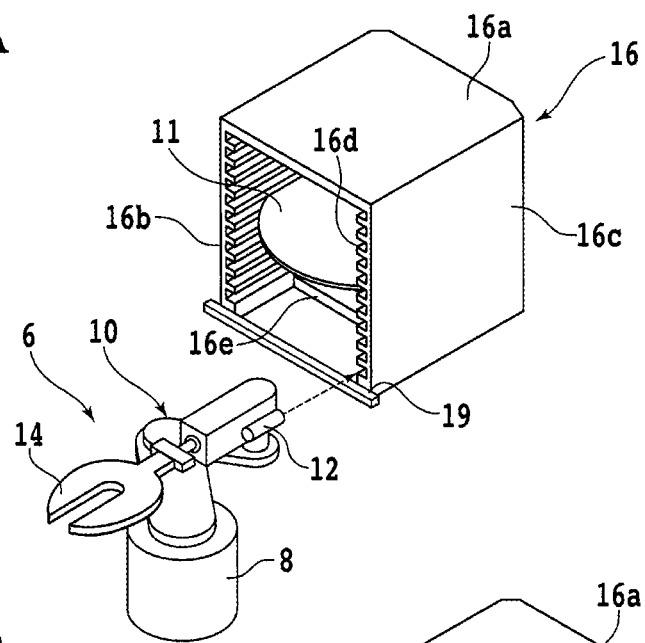
FIG. 6A is a perspective view schematically illustrating a state in an example of operation of the transfer robot that is to unload a workpiece from the cassette.

Next, the processing section 58 causes the imaging unit 12 to image the one end of the placement surface of the cassette table 18a or 18b and the space right above the one end (refer to FIG. 6A). When an image (first image) formed by this imaging contains the side wall 16c of the cassette 16, the processing section 58 measures an interval (first interval: I1) in the Y-axis direction between the one end of the placement surface of the cassette table 18a or 18b and the side wall 16c of the cassette 16 on the basis of the first image.

When the first image does not contain the side wall 16c of the cassette 16, on the other hand, the processing section 58 causes the transfer robot 6 to move along the Y-axis direction by a predetermined distance in such a manner as to move toward another end of the placement surface of the cassette table 18a or 18b. It is to be noted that the predetermined distance is set, for example, to a value substantially equal to a width (length in the Y-axis direction) of a space contained in an image formed by the imaging by the imaging unit 12.

Then, the processing section 58 causes the imaging unit 12 to image a portion of the placement surface of the cassette table 18a or 18b and a space right above the portion. When an image (second image) formed by this imaging contains the side wall 16c of the cassette 16, the processing section 58 measures the first interval I1 on the basis of the first image and the second image.

When the second image does not contain the side wall 16c of the cassette 16, on the other hand, movement of the transfer robot 6 and the imaging by the imaging unit 12 described above are repeatedly carried out until an image containing the side wall 16c of the cassette 16 is formed, and thereafter, the processing section 58 measures the first interval I1.

Subsequently, the imaging unit 12 is positioned at such a position that the imaging unit 12 can image the other end of the placement surface of the cassette table 18a or 18b and a space right above the other end. More specifically, the processing section 58 causes the Y-axis movement mechanism provided inside the opening 4a to be actuated in such a manner that the transfer robot 6 is positioned on a rear side of the other end of the placement surface of the cassette table 18a or 18b.

Figure 6B:
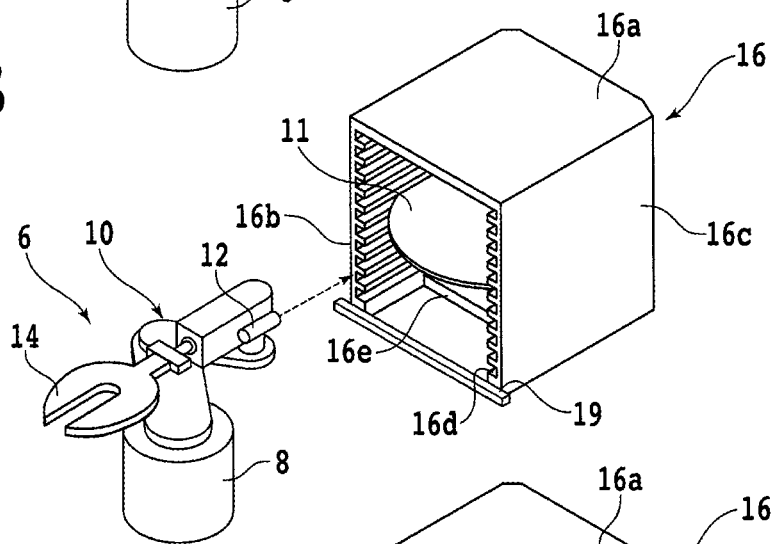
FIG. 6B is a perspective view schematically illustrating another state in the example of operation of the transfer robot that is to unload a workpiece from the cassette.

Next, the processing section 58 causes the imaging unit 12 to image the other end of the placement surface of the cassette table 18a or 18b and the space right above the other end (refer to FIG. 6B). When an image (third image) formed by this imaging contains the side wall 16b of the cassette 16, the processing section 58 measures an interval (second interval: I2) in the Y-axis direction between the other end of the placement surface of the cassette table 18a or 18b and the side wall 16b of the cassette 16 on the basis of the third image.

When the third image does not contain the side wall 16b of the cassette 16, on the other hand, movement of the transfer robot 6 toward the one end of the placement surface of the cassette table 18a or 18b and the imaging by the imaging unit 12 are repeatedly carried out until an image (fourth image) containing the side wall 16b of the cassette 16 is formed. After the fourth image is formed, the processing section 58 measures the second interval I2 on the basis of the third image and the fourth image.

Subsequently, the processing section 58 specifies the position of a center of the cassette 16 in the Y-axis direction on the basis of the first interval I1 and the second interval I2. Where the width, which is stored in the storage section 60, of the placement surface of the cassette table 18a or 18b is denoted by W, for example, the position of the center is a position separated from the one end of the placement surface of the cassette table 18a or 18b by a distance of $\{W+(I1-I2)\}/2$.

The processing section 58 causes data representing the position of the center to be stored in the storage section 60 as data representing the position, in the Y-axis direction, of the robot hand 14 to be inserted into the cassette 16 at the time of unloading the workpiece 11 from the cassette 16.

Then, the imaging unit 12 is positioned at such a position that the imaging unit 12 can image a center of the placement surface of the cassette table 18a or 18b and a space right above the center. More specifically, the processing section 58 causes the Y-axis movement mechanism provided inside the opening 4a to be actuated in such a manner that the transfer robot 6 is positioned on a rear side of the center of the placement surface of the cassette table 18a or 18b.

Figure 6C:
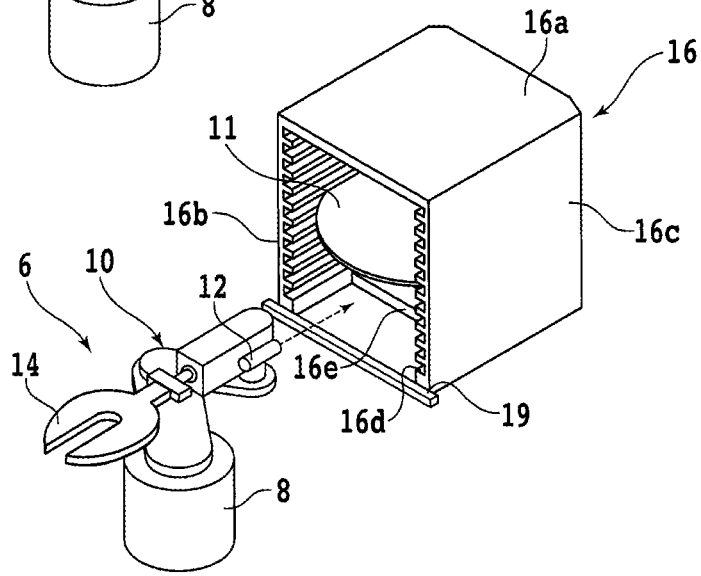
FIG. 6C is a perspective view schematically illustrating yet another state in the example of operation of the transfer robot that is to unload a workpiece from the cassette.

The processing section 58 then causes the imaging unit 12 to image the center of the placement surface of the cassette table 18a or 18b and the space right above the center (refer to FIG. 6C). When an image (fifth image) formed by this imaging contains one or a plurality of workpieces 11, the processing section 58 measures a height of each of the one or plurality of workpieces 11 from the placement surface of the cassette table 18a or 18b, on the basis of the fifth image.

When the fifth image does not contain the top plate 16a of the cassette 16, the processing section 58 causes the actuator provided inside the first drive portion 8 of the transfer robot 6 to raise the imaging unit 12 and the like by a predetermined height. It is to be noted that the predetermined height is set, for example, to a value equal to a height (length in the Z-axis direction) of a space contained in an image formed by the imaging by the imaging unit 12.

Subsequently, the processing section 58 causes the imaging unit 12 to image the space right above the center of the placement surface of the cassette table 18a or 18b. When an image (sixth image) formed by this imaging contains one or a plurality of workpieces 11, the processing section 58 measures a height of each of the one or plurality of workpieces 11 from the placement surface of the cassette table 18a or 18b, on the basis of the fifth image and the sixth image.

When the sixth image does not contain the top plate 16a of the cassette 16, raising of the imaging unit 12 and the like and the imaging by the imaging unit 12 are repeatedly carried out until an image containing the top plate 16a of the cassette 16 is formed. When images formed by this repetition of imaging contain one or a plurality of workpieces 11, the processing section 58 measures a height of each of the one or plurality of workpieces 11 from the placement surface of the cassette table 18a or 18b.

Then, the processing section 58 causes data representing a position obtained by offsetting the measured height of each of the one or plurality of workpieces 11 to be stored in the storage section 60 as data representing the position, in the Z-axis direction, of the robot hand 14 to be inserted into the cassette 16 at the time of unloading each workpiece 11 from the cassette 16. It is to be noted that this offsetting aims at preventing the robot hand 14 from bumping against the workpiece 11 when the robot hand 14 is inserted into the cassette 16.

The amount of offsetting is determined, for example, on the basis of an image (side-wall image) containing two or more grooves 16d adjacent in the Z-axis direction among the plurality of grooves 16d formed on the inner side surfaces of the side walls 16b and 16c of the cassette 16. More specifically, after measuring the interval for arranging the plurality of grooves 16d in the Z-axis direction, on the basis of the side-wall image, the processing section 58 determines a distance of one- to three-quarter times the interval (one half of the interval, for example) as the offset amount.

It is to be noted that the side-wall image is formed, for example, by additional imaging carried out in order to determine the offset amount. Alternatively, if any of the first to fourth images described above contains the two or more grooves 16d, at least one of such images may be utilized as the side-wall image.

Now, one workpiece 11 is unloaded from the cassette 16. When the workpiece 11 is unloaded from the cassette 16, first, the robot hand 14 that has been positioned, on the basis of the data stored in the storage section 60, at a position suitable for unloading the workpiece 11 is inserted into the cassette 16.

For example, the robot hand 14 is inserted into the cassette 16 in the following manner. First, the processing section 58 causes the spindle 10e provided inside the second drive portion 10d to rotate about its rotational axis in such a manner that the holding surface of the robot hand 14 faces upward.

Then, the processing section 58 causes the Y-axis movement mechanism provided inside the opening 4a to be actuated, with reference to the data that represents the position of the robot hand 14 in the Y-axis direction and that is stored in the storage section 60. As a result, the transfer robot 6 is positioned on a rear side of the center of the cassette 16 in the Y-axis direction.

Subsequently, the processing section 58 controls the actuator provided inside the first drive portion 8 of the transfer robot 6 to move the imaging unit 12 and the like up and down, with reference to the data that represents the position of the robot hand 14 in the Z-axis direction and that is stored in the storage section 60. As a result, the holding surface of the robot hand 14 is positioned at a height offset downward by the offset amount described above from the height of the workpiece 11 to be unloaded.

Then, the processing section 58 causes the first arm portion 10a, the second arm portion 10b, and/or the second drive portion 10d to rotate about their respective rotational axes, with reference to the data that represents the position of the robot hand 14 in the Y-axis direction and that is stored in the storage section 60. As a result, the robot hand 14 is inserted into the cassette 16 in a state in which a center of the holding surface of the robot hand 14 in the Y-axis direction agrees with the center of the cassette 16 in the Y-axis direction.

The processing section 58 then controls the actuator provided inside the first drive portion 8 to raise the robot hand 14 and the like in such a manner that the holding surface of the robot hand 14 makes contact with and supports the workpiece 11. The processing section 58 then controls the robot hand 14 to cause the workpiece 11 to be held on the robot hand 14 under suction.

Subsequently, the processing section 58 causes the first arm portion 10*a*, the second arm portion 10*b*, and the second drive portion 10*d* to rotate about their respective rotational axes in such a manner that the workpiece 11 is unloaded from the cassette 16. Accordingly, the unloading of one workpiece 11 from the cassette 16 is completed.

In the above-described transfer apparatus included in the grinding apparatus 2, the position of the robot hand 14 to be inserted into the cassette 16 at the time of unloading the workpiece 11 from the cassette 16 is determined with reference to the plurality of images formed by imaging by the imaging unit 12.

Hence, in the transfer apparatus, it is not necessary for the operator to recognize in advance configuration details of the cassette 16 and a warp or bending of the workpiece 11 accommodated in the cassette 16. Accordingly, the operator's work at the time of unloading the workpiece 11 from the cassette 16 is simplified.

Further, in the transfer apparatus included in the grinding apparatus 2, the workpiece 11 is unloaded from the cassette 16 after the imaging unit 12 images the workpiece 11 accommodated in the cassette 16 to form an image. Hence, in the transfer apparatus, it is possible to readily find an abnormality in an accommodation status of the workpiece 11 in the cassette 16 and an abnormality of the workpiece 11 itself.

It is to be noted that examples of the abnormality in the accommodation status of the workpiece 11 in the cassette 16 include an obliquely inserted state (state in which the outer peripheral edge of one workpiece 11 is supported in grooves 16*d* different in height from each other in the side walls 16*b* and 16*c*) and a doubly inserted state (state in which the outer peripheral edges of two workpieces 11 are both supported in grooves 16*d* of the same height in the side walls 16*b* and 16*c*).

Further, examples of the abnormality of the workpiece 11 itself include a state in which the workpiece 11 has a shape unsuitable for grinding (state in which the workpiece 11 is too thick or too thin, or state in which the workpiece 11 has a too large warp or is bent excessively).

With the grinding apparatus 2, when an abnormality in the accommodation status of the workpiece 11 or an abnormality of the workpiece 11 itself is found, for example, the operator can be notified of an error message via the touch panel or the like.

It is to be noted that the details described above are based on one aspect of the present invention, and the present invention is not limited to them. For example, the transfer apparatus included in the grinding apparatus 2 may be provided with one or a plurality of light sources to be used at the time of imaging by the imaging unit 12.

In this case, for example, the transfer apparatus may have a light source that emits light from an obliquely upper side, a light source that emits light from an obliquely lower side, and a light source that emits light from an obliquely lateral side toward the cassette 16 placed on the cassette table 18*a* or 18*b*. In this transfer apparatus, one region of the cassette 16 may be imaged by the imaging unit 12 with the cassette 16 irradiated with light from the different light sources, thereby forming a plurality of images.

Further, the transfer apparatus may be provided with light sources that can emit light of shape patterns different from each other toward the cassette 16 placed on the cassette table 18*a* or 18*b*. In this transfer apparatus, one region of the cassette 16 may be imaged by the imaging unit 12 with the cassette 16 irradiated with light of shape patterns different from each other, thereby forming a plurality of images.

In a case in which one region of the cassette 16 is imaged under different light irradiation conditions in such a manner and a plurality of images are formed, it is easy to recognize a three-dimensional configuration of the workpiece or workpieces 11 included in the region in more details.

Furthermore, the configuration, method, and the like according to the above-described preferred embodiment may be changed or modified appropriately without departing from the scope of the object of the present invention.

The present invention is not limited to the details of the above-described preferred embodiment. The scope of the invention is defined by the appended claims and all changes and modifications as fall within the equivalence of the scope of the claims are therefore to be embraced by the invention.

What is claimed is:

1. A transfer apparatus comprising:
    a cassette table having a placement surface on which a cassette that has a pair of side walls facing each other and accommodates a workpiece is placed, the pair of side walls having respective inner side surfaces on each of which a plurality of grooves are formed, the workpiece being accommodated with its outer peripheral edge disposed in one of the grooves of each of the side walls;
    a transfer robot that unloads the workpiece from the cassette; and
    a controller that controls operation of the transfer robot,
    wherein the transfer robot includes:
        a transfer arm having a spindle which forms a tip end of the transfer arm that is movable in a first direction perpendicular to the placement surface and a second direction parallel to the placement surface,
        a robot hand that is disposed at the tip end of the transfer arm, such that the robot hand is coupled to the spindle, and is capable of holding the workpiece, and
        an imaging unit that is fixed to a portion of the transfer arm and is capable of imaging a region included in the cassette placed on the placement surface, and
    the controller causes the imaging unit to image different regions of the cassette accommodating the workpiece to form a plurality of images, and thereafter determines a position in the first direction and a position in the second direction of the robot hand to be inserted into the cassette at a time of unloading the workpiece from the cassette, with reference to the plurality of images,
    wherein the controller repeatedly determines whether a reference portion of the cassette is within one of the plurality of images, and when the reference portion of the cassette is not within the one of the plurality of images, the transfer robot is moved a predetermined distance until the imaging unit is positioned such that the image from the imaging unit includes the reference portion of the cassette.

2. The transfer apparatus according to claim 1,
    wherein the plurality of images include a side-wall image formed by imaging a region containing two or more grooves adjacent in the first direction among the plurality of grooves, and the controller measures an interval for arranging the plurality of grooves in the first direction, with reference to the side-wall image, and thereafter determines the position in the first direction of the robot hand at the time of unloading the workpiece from the cassette, with reference to the measured interval.

3. The transfer apparatus according to claim 1, wherein the transfer robot further comprises a drive portion which houses a portion of the spindle, such that the imaging unit is disposed in contacting relationship with a side wall of the drive portion.

4. The transfer apparatus according to claim 3, wherein the spindle is configured and arranged to rotate about an axis of the spindle.

5. The transfer apparatus according to claim 1, wherein the second direction is also perpendicular to the side walls of the cassette, and wherein the spindle rotates about a spindle axis which is perpendicular to the first direction and the second direction, such that that the robot hand rotates about the spindle axis, wherein the robot hand includes an elliptic plate portion which has a shape where a major axis of the elliptic plate extends parallel to the spindle axis.

6. The transfer apparatus according to claim 5, wherein the elliptic plate portion has a linear cutout formed from a center to a tip end of the elliptic plate portion.

7. The transfer apparatus according to claim 1, wherein the robot hand includes a plurality of suction holes on a holding surface of the robot hand, such that the suction holes on the holding surface hold the workpiece under suction.

8. The transfer apparatus according to claim 1, wherein the spindle is configured and arranged to rotate about an axis of the spindle.

9. A transfer apparatus comprising:
a cassette table having a placement surface on which a cassette that has a pair of side walls facing each other and accommodates a workpiece is placed, the pair of side walls having respective inner side surfaces on each of which a plurality of grooves are formed, the workpiece being accommodated with its outer peripheral edge disposed in one of the grooves of each of the side walls;
a transfer robot that unloads the workpiece from the cassette; and
a controller that controls operation of the transfer robot, wherein the transfer robot includes:
a transfer arm having a tip end that is movable in a first direction perpendicular to the placement surface and a second direction parallel to the placement surface,
a robot hand that is disposed at the tip end of the transfer arm and is capable of holding the workpiece, and
an imaging unit that is fixed to the transfer arm and is capable of imaging a region included in the cassette placed on the placement surface, and
the controller causes the imaging unit to image different regions of the cassette accommodating the workpiece to form a plurality of images, and thereafter determines a position in the first direction and a position in the second direction of the robot hand to be inserted into the cassette at a time of unloading the workpiece from the cassette, with reference to the plurality of images,
wherein the controller repeatedly determines whether a reference portion of the cassette is within one of the plurality of images, and when the reference portion of the cassette is not within the one of the plurality of images, the transfer robot is moved a predetermined distance until the imaging unit is positioned such that the image from the imaging unit includes the reference portion of the cassette.

\* \* \* \* \*